United States Patent
Garuts et al.

[11] Patent Number: 5,121,090
[45] Date of Patent: Jun. 9, 1992

[54] BALUN PROVIDING DUAL BALANCED OUTPUTS

[75] Inventors: Valdis E. Garuts; Clifford H. Moulton, both of Beaverton, Oreg.

[73] Assignee: Tektronix, Inc., Beaverton, Oreg.

[21] Appl. No.: 506,132

[22] Filed: Apr. 9, 1990

[51] Int. Cl.$^5$ .................... H01P 5/10; H03H 7/48
[52] U.S. Cl. .................... 333/124; 333/127; 333/25; 333/26
[58] Field of Search .................... 333/25, 26, 124, 127

[56] References Cited

U.S. PATENT DOCUMENTS

| | | | |
|---|---|---|---|
| 3,103,638 | 9/1963 | Greuet | 333/25 X |
| 3,311,850 | 3/1967 | Podell | 333/26 X |
| 3,428,919 | 2/1969 | Webb | 333/25 X |
| 3,508,171 | 4/1970 | Podell | 333/25 X |
| 4,391,278 | 9/1981 | Quine | 333/26 X |
| 4,647,868 | 3/1987 | Mueller | 333/25 X |
| 4,916,410 | 4/1990 | Littlefield | 333/127 X |
| 4,916,415 | 10/1990 | Moulton et al. | 333/26 |

OTHER PUBLICATIONS

C. L. Ruthroff, "Some Broad-Band Transformers", Proc. IRE., Aug. 1959, pp. 1337–1342.
H. Granberg, Broadband Transformers and Power Combining Techniques for RF, AN-749 Motorola Semiconductor Products Inc., 1975.

Primary Examiner—Eugene R. LaRoche
Assistant Examiner—Benny Lee
Attorney, Agent, or Firm—John D. Winkelman; John Smith-Hill

[57] ABSTRACT

A dual output balun distributes substantially all of the available power in a single ended input signal applied thereto (less small parasitic losses) equally to two or more pairs of push-pull output terminals (or vice versa).

6 Claims, 4 Drawing Sheets

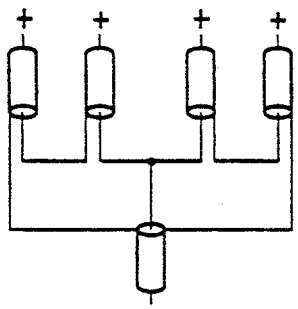
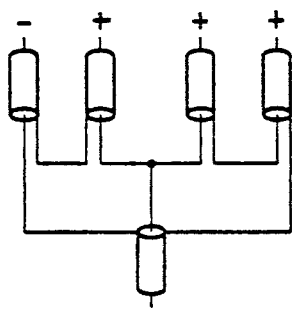
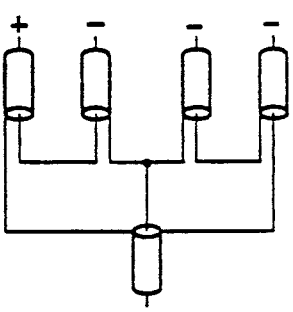
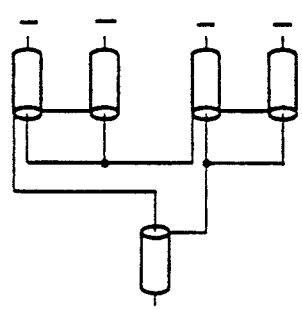
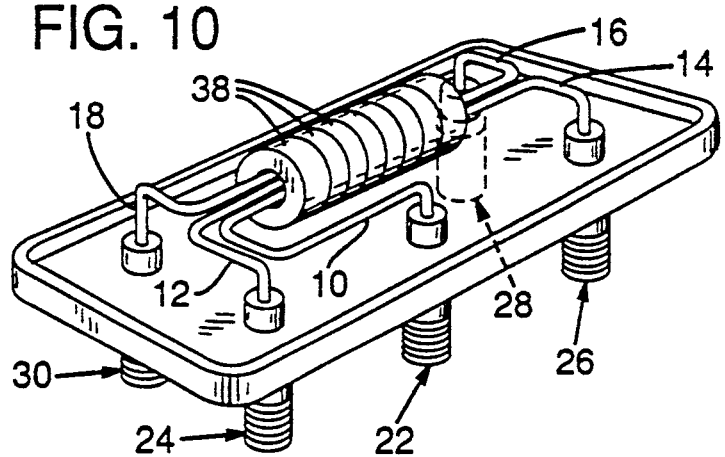
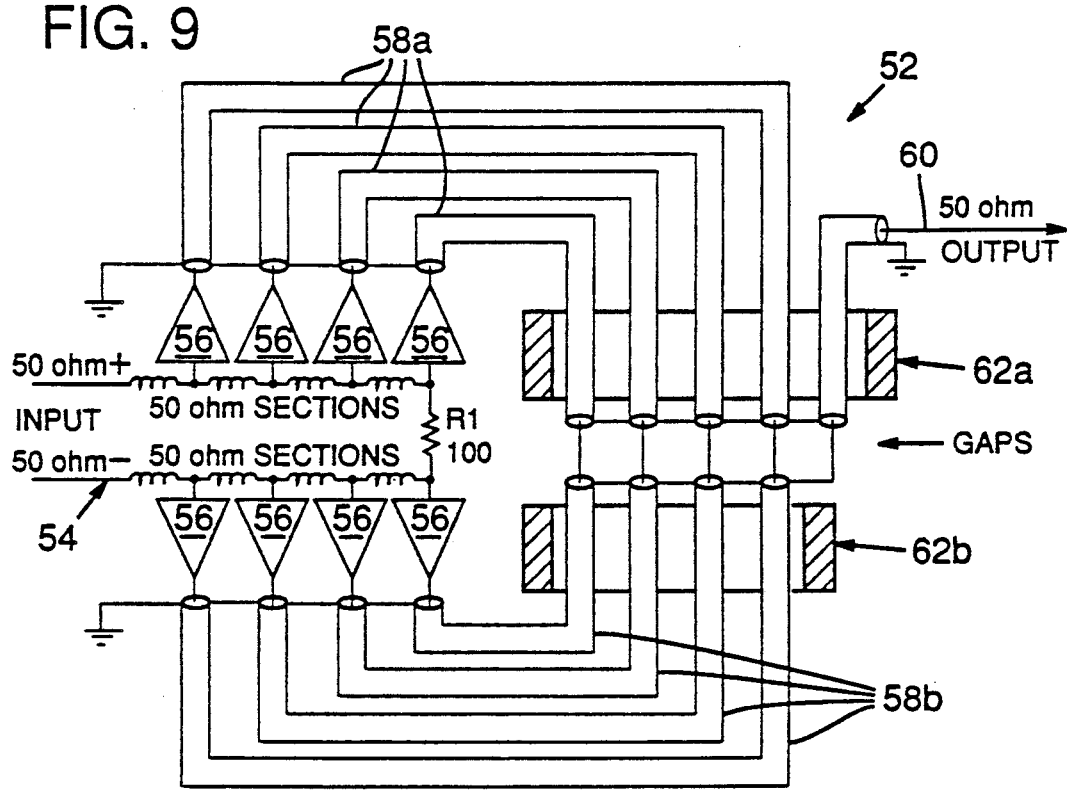

BALUN PROVIDING DUAL BALANCED OUTPUTS

TECHNICAL FIELD

The present invention relates to baluns, and more particularly relates to a class of simple baluns that provides two or more pairs of differential outputs from a single unbalanced input.

BACKGROUND AND SUMMARY OF THE INVENTION

High speed electronic circuits, such as microwave amplifiers and sub-nanosecond logic, often employ differential circuitry, and consequently operate with push-pull input signals. In some instances, such circuitry requires not just one push-pull input signal, but two or more, each with equal amplitudes.

Conventional signal sources have single-ended outputs. To convert single-ended signals into two or more equal amplitude push-pull signals, an arrangement including a balun cascaded with two power splitters (FIG. 1), or a power splitter cascaded with two baluns (FIG. 2), may be used. Unfortunately, conventional power splitters only deliver one-fourth the input power to each of the two outputs. (The remaining half of the input power is dissipated in internal impedance matching resistors.) This loss, coupled with the losses associated with the balun(s), typically leaves less than 45 percent of the input signal for application to the circuitry.

High frequency signal power is always at a premium, so it is desirable to minimize the above-described losses.

In accordance with the present invention, a dual output balun distributes all the signal power applied to the balun, less small parasitic losses, equally to two (or more) push-pull output paths, thereby providing about a 7 dB improvement in efficiency over conventional balun and power splitter approaches. The balun includes a single ended input port for receiving a single ended input signal, two balanced, push-pull output ports, and a transformer: (a) for receiving a single ended input signal from the input port; (b) converting the single ended input signal into a pair of balanced output signals; and (c) and providing the output signals to the output ports.

The foregoing and additional features and advantages of the present invention will be more readily apparent from the following detailed description, which proceeds with reference to the accompanying drawings.

BRIEF DESCRIPTION OF THE DRAWINGS

FIGS. 7a–7d are illustrations of alternative forms of the invention to achieve various combinations of inverting and non-inverting outputs.

FIG. 9 details the construction of the multiple output-line balun employed in the FIG. 8 embodiment.

FIG. 10 is an isometric view of the balun of FIG. 4a.

Figure 1:
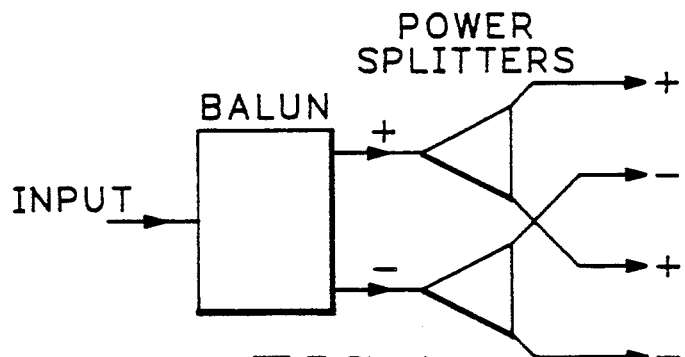
FIG. 1 is a schematic block diagram of a prior art system employing two power splitters cascaded after a balun to produce two pairs of push-pull output signals from a single ended input signal.
Figure 2:
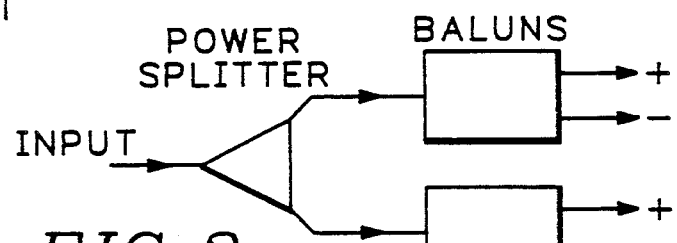
FIG. 2 is a schematic block diagram of a prior art system employing two baluns cascaded after a power splitter to produce two pairs of push-pull output signals from a single ended input signal.

In the drawings, the polarity sign (+ or −) adjacent an output terminal of a balun indicates whether the signal present at that output terminal is inverted (−) or non-inverted (+) relative to the input signal of the balun.

DETAILED DESCRIPTION

The baluns that are illustrated in FIGS. 4a–4d invention are each comprised of five coaxial transmission lines 10, 12, 14, 16, 18 (one input and four output, respectively) of equal characteristic impedances $Z_0$ in a series-parallel arrangement in which the input ends of a pair of output lines are connected in series (yielding an impedance of $2Z_0$), and these two series pairs are connected in parallel, across the balun input 22a, 22b (yielding an impedance of $Z_0$). Since the parallel connection presents an impedance of $Z_0$ to the $Z_0$ input line, all the available input power is transmitted to the outputs.

Figure 3:
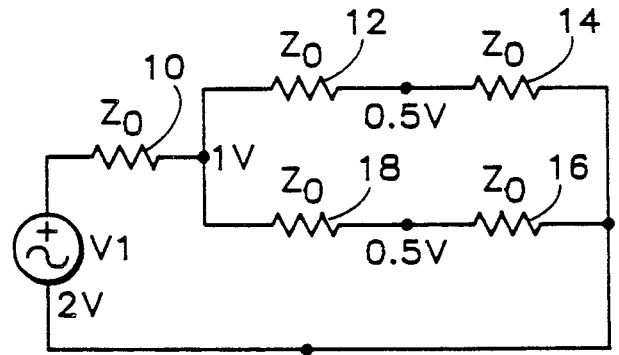
FIG. 3 is a schematic illustration of a series-parallel realization of the present invention in equivalent circuit form.

The foregoing may more readily be seen from the equivalent circuit of FIG. 3, in which each line is represented at the junction by its impedance $Z_0$. The input line 10 is represented by its open circuit voltage V and impedance $Z_0$. Since the connection of the output lines 12, 14, 16, 18 presents an impedance $Z_0$ to the input line, all the power available from the input is delivered to the output lines. Due to the equal values of output line impedances, each receives ¼ of the available power. By properly connecting the inner and outer conductors of the output lines, two outputs are noninverted with respect to the input, and two are inverted.

Figure 4A:
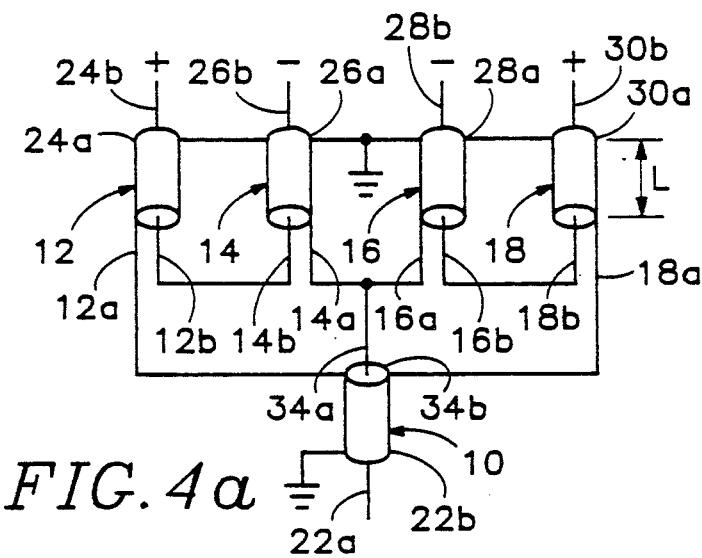
FIGS. 4a–4d are illustrations of actual implementations of the FIG. 3 form of the invention.

Referring particularly to FIG. 4a, there are four pairs of balun output terminals 24a/24b, 26a/26b, 28a/28b, and 30a/30b, defined by the end terminals of the four unbalanced transmission lines 12, 14, 16, 18. The input terminals 12a/12b, 14a/14b, 16a/16b and 18a/18b of these lines are connected to each other and are connected to the balun input terminals 22a, 22b in such a manner as to provide an impedance $Z_0$ across the balun input terminals when the balun output terminals are each terminated in impedance $Z_0$. Also illustrated in FIG. 4a is the unbalanced input transmission line 10 which defines at one end the balun single-ended input terminals 22a, 22b and has at the other end first and second terminals 34a, 34b.

In greater detail, the first balun input terminal 22a is connected to the first input terminal 14a of the second unbalanced transmission line 14, and is also connected to the first input terminal 16a of the third unbalanced transmission line 16. The second balun input terminal 22b is connected to the first input terminal 12a of the first unbalanced transmission line 12, and is also connected to the first input terminal 18a of the fourth unbalanced transmission line 18. The second input terminals 12b, 14b of the first and second unbalanced transmission lines 12, 14 are connected, as are the second input terminals 16b, 18b of the third and fourth transmission line 16, 18.

Figure 4B:
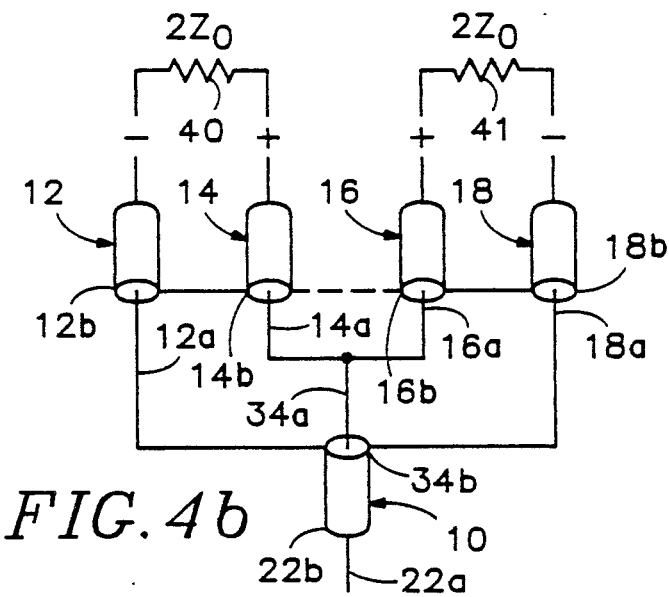
Figures 4C, 4D:
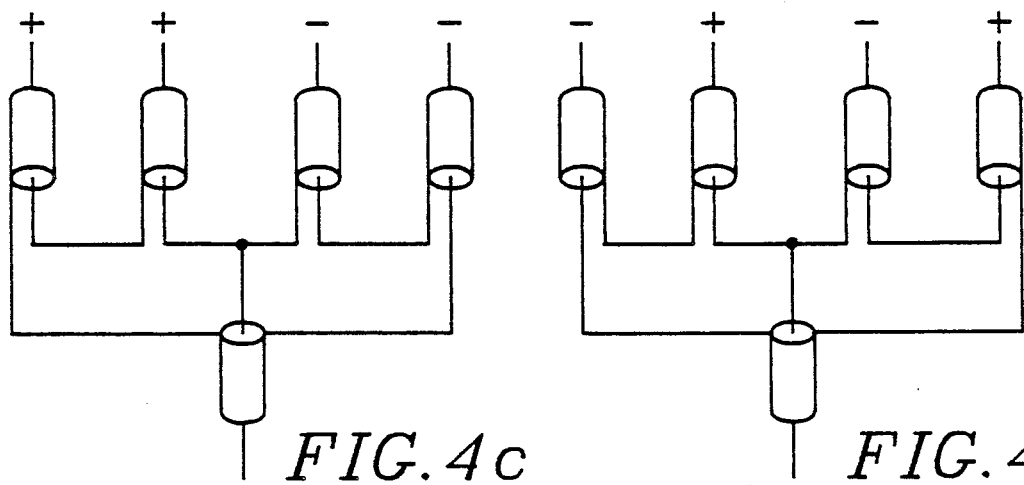

It can be seen by inspection of FIGS. 4b-4d that the connections of the terminals 12a, 12b, 14a, 14b, 16a, 16b, 18a, 18b of the unbalanced transmission lines 12, 14, 16, 18 to the balun input terminals 22a, 22b provide the equivalent circuit shown in FIG. 3.

Figure 6A:
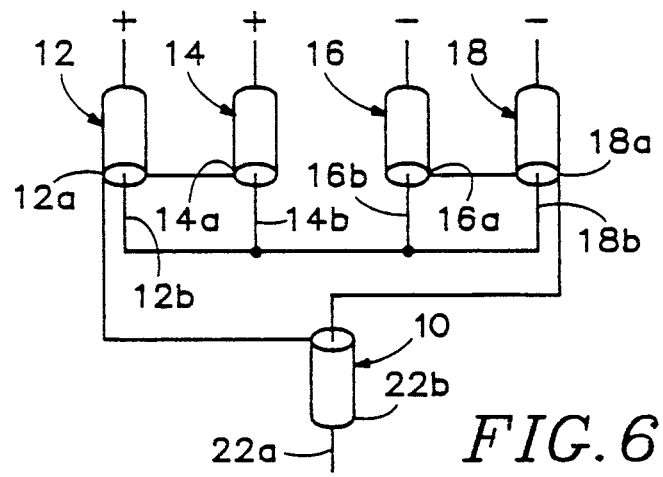
FIGS. 6a–6c are illustrations of actual implementations of the FIG. 5 form of the invention.
Figure 6B:
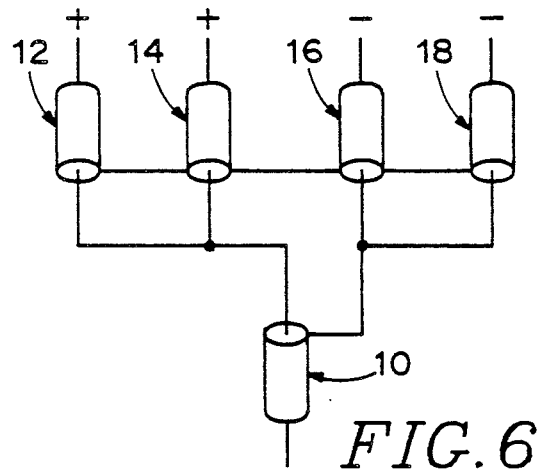
Figure 6C:
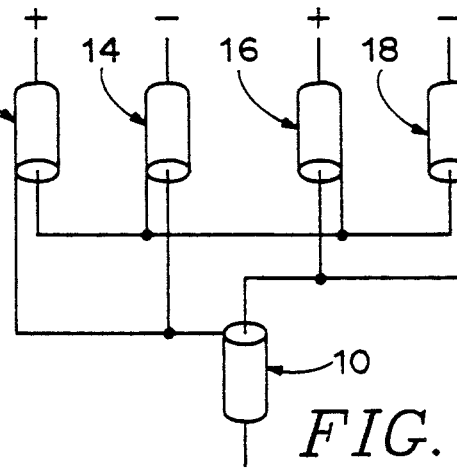

The baluns shown in FIGS. 6a-6c are also composed each of five coaxial transmission lines 10, 12, 14, 16, 18 of equal characteristic impedance $Z_0$, but in a parallel-series arrangement in which the input ends of a pair of output lines are connected in parallel (yielding an impedance of $Z_0/2$), and the two parallel pairs are connected in series across the input line (yielding an impedance of $Z_0$). Since the series connection presents an impedance of $Z_0$ to the $Z_0$ input line, all the available input power is transmitted to the outputs.

Figure 5:
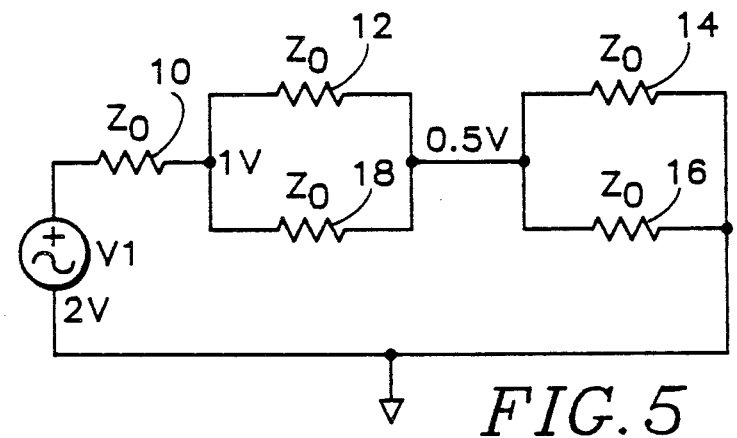
FIG. 5 is a schematic illustration of a parallel-series realization of the present invention in equivalent circuit form.

This may more readily be seen from the equivalent circuit of FIG. 5, in which each line is represented at the junction by its impedance $Z_0$. In response to a terminated input voltage V1, the voltage across each output line is V1/2. Hence, each output receives ¼ of the power which would be delivered to a single $Z_0$ termination of terminated output line.

Referring to FIG. 6a, a first balun input terminal 22b is connected to the first input terminal 12a of the first unbalanced transmission line 12, and is also connected to the first input terminal 14a of the second unbalanced transmission line 14. The second balun input terminal 22a is connected to the first input terminal 16a of the third unbalanced transmission line 16, and is also connected to the first input terminal 18a of the fourth unbalanced transmission line 18. The second input terminals 12b, 14b, 16b, 18b of the unbalanced transmission lines are all connected together.

Inspection of FIGS. 6b and 6c shows that the connections of the terminals of unbalanced transmission lines 12, 14, 16, 18, to the input line 10 provide the equivalent circuit shown in FIG. 5.

LOW FREQUENCY OPERATION

To evaluate low frequency operation, it is helpful to consider that the outer conductor of the input line is at zero (ground) potential. Some of the output outer conductors, in contrast, have a non-zero voltage at their junctions with other conductors. However, at the balun's output connections, these outer conductors are grounded. The electrical length L (FIG. 4a) of these outer conductors between the junction and ground determines the lowest frequency to which a balanced output is obtained. To increase this electrical length, and thereby to extend the low frequency performance, these lines are desirably enclosed in a sheath 38 (FIG. 10) of magnetic material. Groups of lines having the same outer conductor voltage polarity at the junction are each enclosed in common sheathing to minimize the bulk and cost of the device. Groups of outer conductors having different potentials are enclosed in separate sheaths.

It will be recognized that the embodiments described above each perform the basic function of providing two pairs of balanced outputs. However, each has other benefits and drawbacks, as detailed below.

The connections of FIGS. 4c, 4d and 6c have outer conductors at two different voltages, requiring two separate sheaths, while the other connections need only one.

In the FIG. 4a arrangement, the center conductors of each balanced output line pair are at the same static potential, which can be set to any value relative to ground and to the other pair. This allows biasing these lines to whatever common mode voltage is required by the corresponding inputs of the device(s) being driven. However, the signal output voltages decrease to zero at low frequency. Further, the impedance presented at the signal input becomes a short-circuit to ground at DC, which may cause problems with some sources.

In the FIGS. 4b and 6b arrangements, all output outer conductors are at the same voltage, offering the possibility of redefining these to be ground. In these cases, however, the outer conductor of the input line 10 is not at ground and needs to be sheathed. Fortunately, this is a single line and requires only a small diameter sheath. To increase the sheathed electrical length, the line can be made longer and/or coiled, in less space than all four output conductors. Note that to maintain equal electrical signal path lengths to all outputs, all output lines must have the same physical length.

The FIGS. 4b and 6b arrangements have the property that if the output lines are differentially terminated, as in FIG. 4b, by resistors 40, 41, the total differential output of each pair is constant down to DC, transitioning from balanced to single-ended as the impedance of the inductor formed by the sheathed outer conductors decreases below $Z_0$. Many test devices operate satisfactorily with single-ended input at low frequency, so this is a useful feature. In these embodiments, the input line 10 remains terminated in $Z_0$ at all frequencies to DC.

RELATED CIRCUITS

By interchanging the connections of the inner and outer conductors of any output line, its output polarity is reversed. Thus, it is also possible to construct lossless and forward-matched devices which distribute all of the available input power to either: (a) four non-inverting outputs; (b) three non-inverting and one inverting output; (c) one non-inverting and three inverting outputs; or (d) four inverting outputs. Example circuits which perform each of these functions are shown in FIGS. 7a-7d, respectively. These circuits are not exhaustive; there are additional configurations which achieve the same results. The illustrated configurations serve merely to demonstrate the flexibility of this method of power splitting.

BIDIRECTIONAL OPERATION

All of the above-described embodiments are bidirectional. If the signals on all of the output lines in forward operation are applied to the outputs, then the original input signal is regenerated.

MORE THAN TWO BALANCED OUTPUTS

The above-described methodology is not limited to two pairs of balanced output lines but can be extended to three, four, or more pairs as well. However, in most of these cases the input line impedance will have to be different from the output lines to obtain proper matching.

Figure 8:
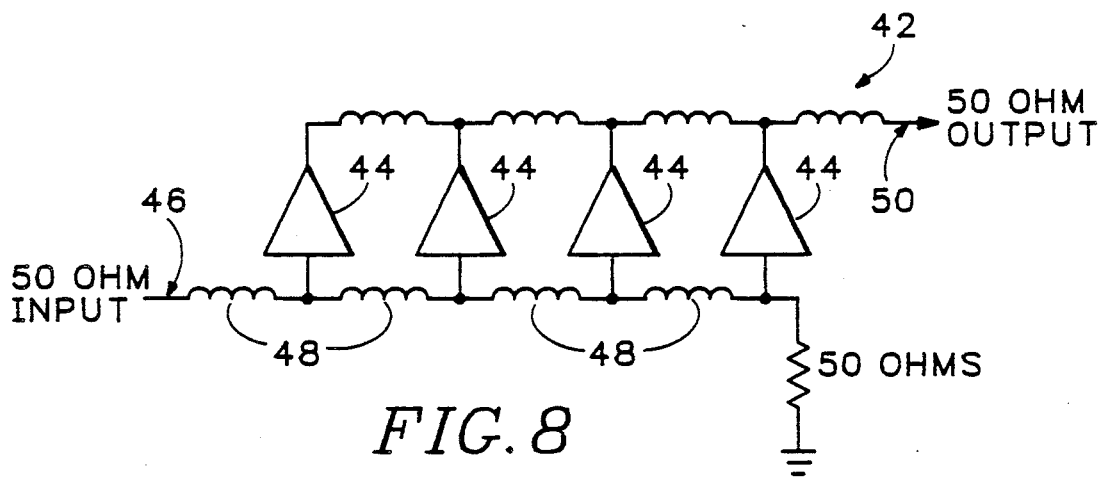
FIG. 8 illustrates application of a multiple output-line form of the invention to a tapered distributed amplifier.

One application for multiple output lines is as an output combiner network for a tapered distributed amplifier (FIGS. 8, 9). In the amplifier 42 of FIG. 8, an input signal is provided, at successively greater time delays, to the inputs of a series of amplifiers 44. The input time delay intervals are set by a synthetic transmission line 46 formed with series inductive components 48 and shunt capacitive components. (Capacitive reactances presented by the amplifier inputs provide the line's capacitive components). In order for the output signals from these amplifiers to add constructively, the effects of these input time delays must be reversed and canceled. In the prior art, this is accomplished by a second, output LC tapered delay line 50.

FIG. 9 illustrates the application of a multiple line balun according to the present invention to such a tapered distributed amplifier. In the FIG. 9 amplifier 52, a tapered input line 54 (balanced this time) is again employed to drive the amplifiers 56 in time-staggered fashion. The amplifier outputs, however, are connected to 100 ohm coaxial cables 58a, 58b whose different lengths are chosen to introduce time delays such that the total time delays of all signal paths including the input signal lines 54 and output lines 58 are equal. The outer conductors of the top four cables 58a are connected in parallel and drive the shield of the 50 ohm output line 60. The outer conductors of the bottom four cables 58b are connected in parallel and to the center conductor of line 60. The center conductors of corresponding length cables 58a and 58b are connected together. Thus, each such pair of cables presents a 200 ohm impedance across output line 60. The parallel combination of these four 200 ohm sources yields a 50 ohm source impedance which matches the 50 ohm impedance of the output line 60. It will be recognized that in addition to serving as a combiner, the balun is here used to convert from balanced to single ended. Again, toroidal sheaths 62a, 62b are used to lengthen the effective line lengths, and thereby extend the low frequency response of the balun. This structure is seen to be similar to the example of FIG. 4(a), except that there are now four pairs of balanced signals, and that power flows from the balanced to the single ended side of the balun.

MEASURED PERFORMANCE

The FIG. 4a embodiment was constructed in the form shown in FIG. 10. This unit yielded a bandwidth in excess of 10 GHz and a power efficiency of 90 percent. The four outputs are well matched in waveshape and delay. The low frequency $-3$ dB point was measured as 160 KHz and the high frequency $-3$ dB point was near 10 GHz, thus providing in excess of four decades in frequency bandwidth.

The sheathing of the transmission lines is well illustrated in FIG. 10. In the FIG. 4a embodiment which is represented by this figure, the outer conductors of input coaxial line 10 and output coaxial lines 12, 18 are connected together and thus are at the same potential. This permits a single sheath to be used around all three of these lines. The outer conductors of the remaining two output coaxial lines 14, 16 are similarly at the same potential and thus are sheathed together. (The interconnections among the 5 cables are obscured in FIG. 10 by the toroidal sheathing cores 38.)

Having described and illustrated the principles of our invention with reference to several preferred embodiments thereof, it will be apparent that the invention can be modified in arrangement and detail without departing from such principles. Accordingly, we claim as our invention all such modifications as may come within the scope and spirit of the following claims and equivalents thereto.

We claim:

1. A balun comprising:
a single-ended input port including first and second terminals for receiving a single-ended input signal;
first and second balanced output ports each having two terminals for providing respective first push-pull output signals, whereby the balun has four output terminals; and
transmission line transformer means for receiving a single-ended input signal from the input port, converting the single-ended input signal into first and second push-pull output signals, and providing the output signals to the first and second output ports respectively, said transmission line transformer means comprising an input transmission line segment having first and second opposite ends, and first, second, third and fourth output transmission line segments each having first and second opposite ends, and each transmission line segment comprising a first conductor and a second conductor, the first and second conductors of the input transmission line segment being connected at the first end thereof to the first and second terminals respectively of the input port, the first conductors of the first and second output transmission line segments being connected at the first end thereof to the first conductor of the input transmission line segment at the second end thereof, the first conductors of the third and fourth output transmission line segments being connected at the first end thereof to the second conductor of the input transmission line segment at the second end thereof, the second conductor of the first output transmission line segment being connected at the first end thereof to the second conductor of the third output transmission line segment at the first end thereof, and the second conductor of the second output transmission line segment being connected at the first end thereof to the second conductor of the fourth output transmission line segment at the first end thereof, one conductor of each of the four output transmission line segments being connected at the second end thereof to the four output terminals respectively of the balun.

2. A balun according to claim 1, wherein the four output transmission line segments are each of the same characteristic impedance $Z_0$ and the first and second output ports are each terminated in an impedance $2Z_0$.

3. A balun according to claim 1, wherein each transmission line segment comprises a coaxial transmission line segment having a core conductor and a shield conductor.

4. A balun according to claim 3, wherein the first conductor of the input transmission line segment is the shield conductor thereof and the first conductor of each of the output transmission line segments is the shield conductor thereof.

5. A balun according to claim 2, wherein the first conductor of the output transmission line segment is the shield conductor thereof and the first conductor of each of the output transmission line segments is the core conductor thereof.

6. A balun according to claim 1, wherein the input transmission line segment and the first, second, third and fourth output transmission line segments are of equal characteristic impedance.

* * * * *